United States Patent
Wang

(10) Patent No.: US 6,504,381 B1
(45) Date of Patent: Jan. 7, 2003

(54) TWO-OUTPUT VOLTAGE TEST SYSTEM

(75) Inventor: Simon Wang, Taipei (TW)

(73) Assignee: Chroma Ate Inc., Taipei Hsien (TW)

( * ) Notice: Subject to any disclaimer, the term of this patent is extended or adjusted under 35 U.S.C. 154(b) by 47 days.

(21) Appl. No.: 09/677,343

(22) Filed: Oct. 2, 2000

(51) Int. Cl.⁷ .................. H01H 31/12; G01R 31/14
(52) U.S. Cl. .............................. 324/551; 324/509
(58) Field of Search ..................... 324/522, 541, 324/544, 548, 551, 509

(56) References Cited

U.S. PATENT DOCUMENTS 6,043,665 A * 3/2000 Nishioka et al. ............ 324/548
6,127,828 A * 10/2000 Kamitani ..................... 324/537

* cited by examiner

*Primary Examiner*—N. Le
*Assistant Examiner*—J. Kerveros
(74) *Attorney, Agent, or Firm*—Bucknam and Archer

(57) ABSTRACT

The disclosure provides a two-output voltage test system, wherein the system includes a plurality of D/A converters, buffers, sinusoidal wave generators, power amplifiers, and a micro-processing controller. The two-output voltage test system provides for a number of processes including one group of the plurality of D/A converters, buffers, sinusoidal wave generators, and power amplifiers to perform the measurement of AC voltage durability ($W_{AC}$), DC voltage durability ($W_{DC}$), insulation resistance (IR), and leakage current (LK). The other group of the plurality of D/A converters, buffers, sinusoidal wave generators, and power amplifiers performs the measurement of ground resistance (GR). The micro-processing controller outputs the measurements simultaneously or with slight time delay in order to obtain the results measured at the same time.

2 Claims, 2 Drawing Sheets

A BLOCK DIAGRAM OF TWO-OUTPUT VOLTAGE TEST SYSTEM

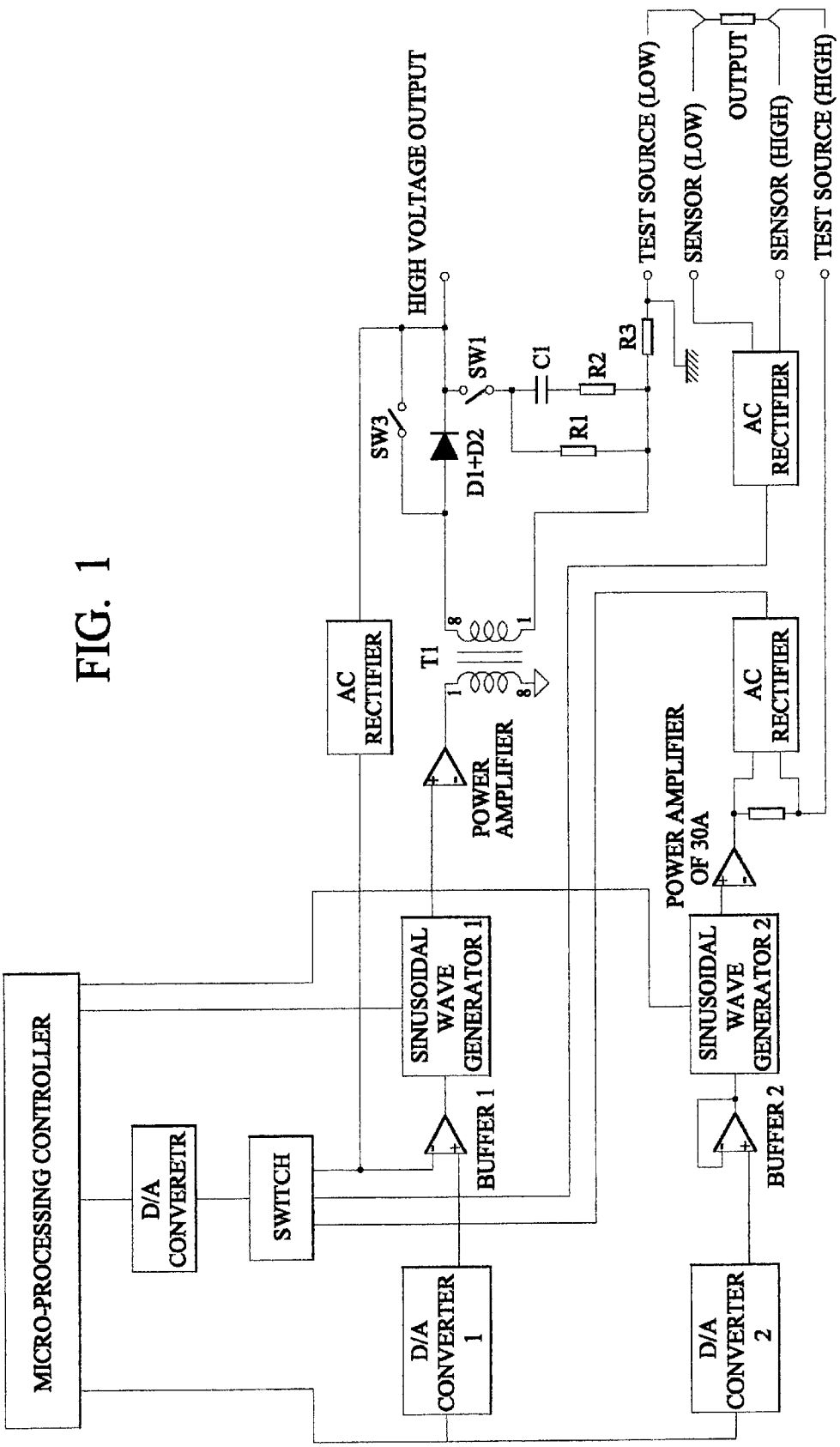

T1 : START THE TEST
T2 : STOP THE TEST
T3 : A/D < 30 VOLTS
T4 : NEXT TEST

TWO-OUTPUT VOLTAGE TEST SYSTEM

FIELD OF THE INVENTION

The invention relates to a two-output voltage test system, and particularly relates to a two-output voltage test system that can simultaneously perform two test modes to reduce the total testing time and to increase the whole measure efficiency.

BACKGROUND OF ART

In general, prior voltage test system use staged test to achieve the purpose of product testing, wherein the total test time is the sum of the time spent for each test. However, when massive amount of voltage tests are used, it will take a very long testing time and affect the production yield.

For example, in a prior voltage test system, in general, the testing times are: 3 seconds for the ground resistance test, 3 seconds for the voltage test, and 1 second for the leakage current test, thus the total test time of said prior test system will be 7 seconds (i.e. 3+3+1 seconds), which does not include the delay time or manual test time during test period. Therefore in the 24 hours of a day it is possible to perform 86400 seconds÷7 seconds=12342 tests.

SUMMARY OF THE INVENTION

Therefore, it is necessary to develop a time conserving voltage system that can measure at least two tests simultaneously, so that it is possible to reduce total test time arid to increase the production yield.

Referring to FIG. 2B, which is a time flow chart showing the operation of a two-output voltage test system according to present invention, in which examples of measurement on the ground resistance (GR) and AC voltage durability ($W_{AC}$) were shown. The system of present invention uses two groups constituted of a A/C converter, a buffer, a sinusoidal wave generator, a power amplifier, and a micro-processing controller for simultaneously performing the measurement of the ground resistance (GR) and AC voltage durability ($W_{AC}$). Since those measurements were taken simultaneously and the micro-processing controller also output all signals measured at the same time, therefore the measuring time is still 3 seconds.

As described above, the testing time according to present invention referred to simultaneous measurement of the ground resistance (GR) and AC voltage durability ($W_{AC}$), therefore said testing time will be for example 3 seconds. If added to 1 second spent on automatic measurement for leakage current, it is possible to perform 86400 seconds÷4 seconds=21600 tests in the 24 hours of a day, which has almost double the efficiency comparing to 12342 tests in the prior measurement.

BRIEF DESCRIPTION OF DRAWINGS

FIG. 1 is a block diagram showing a two-output voltage test system according to present invention;

DETAILED DESCRIPTION OF THE INVENTION

Figure 2A:
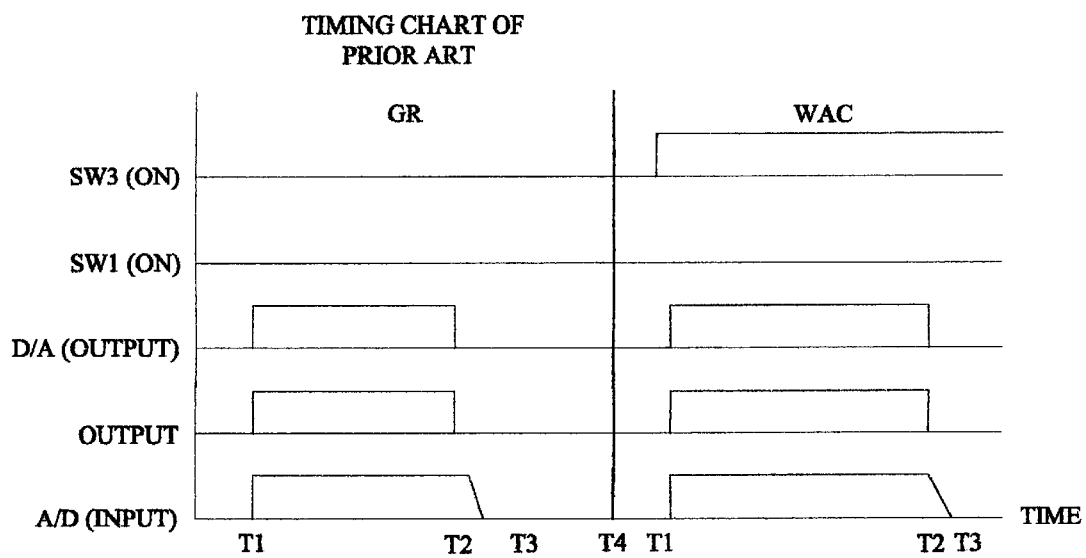
FIG. 2A is a time flow chart showing the operation of a voltage test of prior art.
Figure 2B:
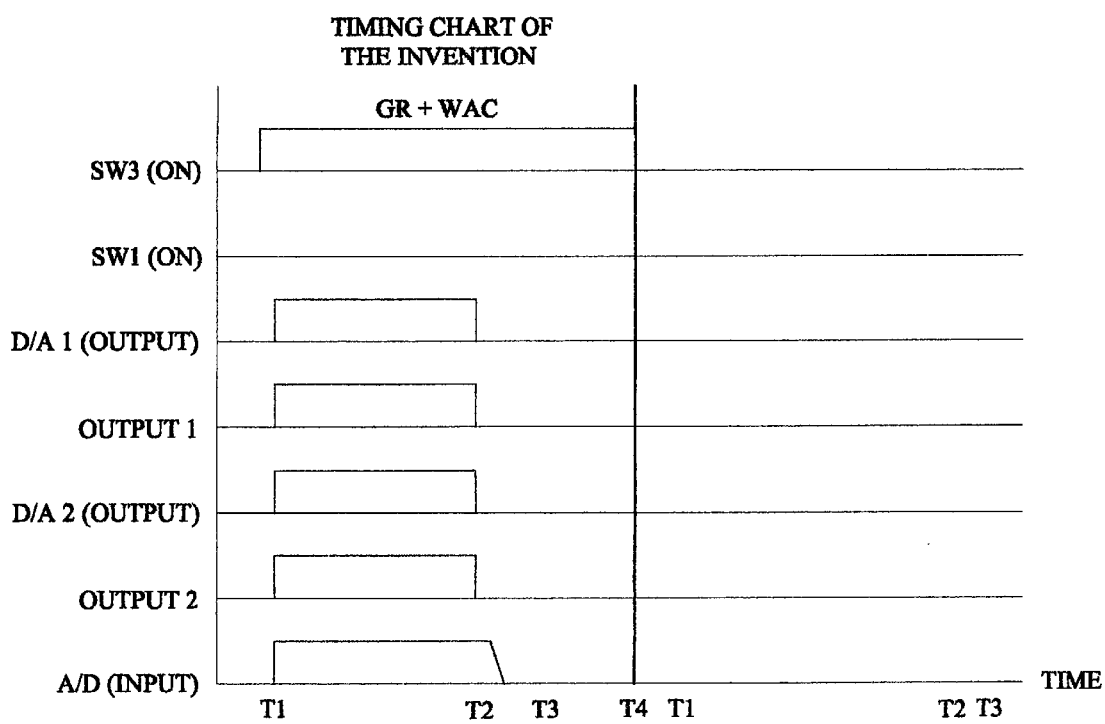
FIG. 2B is a time flow chart showing the operation of a two-output voltage test system according to present invention.

The following description will provide a complete understanding of present invention, however it is descriptive but not the limit of present invention, and it is apparent that for those who are skilled in prior art to carry out the invention without specific detailed contents.

Referring to the block diagram of FIG. 1, a two-output voltage test system according to present invention is shown. As shown in the figure, said two-output voltage test system has two groups constituted of a D/A converter, a buffer, a sinusoidal wave generator and a power amplifier, and a micro-processing controller. It is possible to use one of these groups, i.e. D/A converter 1, buffer 1, sinusoidal wave generator 1 and a power amplifier, to perform the measurement of AC voltage durability ($W_{AC}$) DC voltage durability ($W_{DC}$), insulation resistance (IR), and leakage current (LK) and to output measured signals. It is also possible to use the other group, i.e. D/A converter 2, buffer 2, sinusoidal wave generator 2, and a power amplifier of 30A, to perform the measurement of ground resistance (GR) and to output the measured signal. Then, using said micro-processing controller to output all measured signal. Then, using said micro-processing controller to output all measured signals simultaneously or with slight time delay.

Referring to FIG. 2A, a time flow chart showing a voltage test system of prior art. Said system used only one group constituted of a D/A converter, a buffer, a sinusoidal wave generator, and a power amplifier to perform the measurement of ground resistance (GR) and AC voltage durability ($W_{AC}$), respectively. The measurement time is a sum of two individual measurement time, that is, as described above the total measurement time is for example at least 3+3=6 seconds which does not include the delay time during the measurement.

Therefore, an object of present invention is to provide a two-output voltage test system, which can simultaneously perform more than two operations with respect to voltage test to achieve the purpose of reducing the total measure time and increasing the efficiency of the whole test.

According to present invention, there is to provide a two-output voltage test system, wherein said two-output voltage test system has a plurality of D/A converter, a buffer, a sinusoidal wave generator, a power amplifier, and a micro-processing controller, characterized in that a number of processes including:

using one of the group constituted of said plurality of D/A converter, a buffer, a sinusoidal wave generator and a power amplifier, to perform the measurement of AC voltage durability ($W_{AC}$), DC voltage durability ($W_{DC}$), insulation resistance (IR), and leakage current (LK) and to output measured signals:

using the other group constituted of said plurality of D/A converter, a buffer, a sinusoidal wave generator and a power amplifier, to perform the measurement of ground resistance (GR); and using said micro-processing controller to output all measured signals simultaneously or with slight time delay in order to obtain results measured at the same time, Above and other objects, properties and advantages of present invention will become more apparent from the following description and claims in connection with the accompanying drawings.

What is claimed is:

1. A two-output voltage test system comprising a plurality of D/A converters, buffers, sinusoidal wave generators and power amplifiers, and a micro-processing controller, wherein one group of said plurality of D/A converters, buffers, sinusoidal wave generators, and power amplifiers perform the measurement of AC voltage durability ($W_{AC}$), DC voltage durability ($W_{DC}$), insulation resistance (IR), and leakage current (LK), and another group of said plurality of D/A converters, buffers, sinusoidal wave generators, and power amplifiers perform the measurement of ground resistance; and said micro-processing controller outputs said measurements substantially simultaneously in order to obtain the results measured at the same time.

2. A two-output voltage test system according to claim 1 wherein said measurements of voltage and ground resistance are performed simultaneously.

* * * * *